(12) United States Patent
Chow

(10) Patent No.: US 6,876,567 B2
(45) Date of Patent: Apr. 5, 2005

(54) FERROELECTRIC MEMORY DEVICE AND METHOD OF READING A FERROELECTRIC MEMORY

(75) Inventor: David GenLong Chow, Los Altos, CA (US)

(73) Assignee: Intel Corporation, Santa Clara, CA (US)

( * ) Notice: Subject to any disclaimer, the term of this patent is extended or adjusted under 35 U.S.C. 154(b) by 564 days.

(21) Appl. No.: 10/028,182

(22) Filed: Dec. 21, 2001

(65) Prior Publication Data

US 2003/0120859 A1 Jun. 26, 2003

(51) Int. Cl.[7] .......................... G11C 11/22; G11C 5/06; G11C 7/00; G11C 7/02; G11C 8/00
(52) U.S. Cl. .................... 365/145; 365/65; 365/189.02; 365/189.05; 365/189.09; 365/207; 365/230.03; 365/230.04; 365/230.06; 365/230.08
(58) Field of Search .................... 365/145, 65, 189.02, 365/189.05, 189.09, 207, 230.03, 230.04, 230.06, 230.08

(56) References Cited

U.S. PATENT DOCUMENTS

| | | | | |
|---|---|---|---|---|
| 5,570,319 A | * | 10/1996 | Santoro et al. | 365/230.03 |
| 6,256,262 B1 | * | 7/2001 | Chen et al. | 365/233 |
| 6,551,846 B1 | * | 4/2003 | Furutani et al. | 438/17 |
| 6,556,490 B2 | * | 4/2003 | Shubat et al. | 365/200 |
| 6,567,299 B2 | * | 5/2003 | Kunikiyo et al. | 365/173 |
| 2001/0009526 A1 | * | 7/2001 | Andersen et al. | 365/207 |
| 2003/0002315 A1 | * | 1/2003 | Ooishi | 365/63 |
| 2004/0120202 A1 | * | 6/2004 | Terzioglu et al. | 365/222 |

OTHER PUBLICATIONS

Safari, Ahmad; Panda, K. Rajesh; Janas, Victor F.; "Ferroelectric Ceramics: Processing, Properties & Applications" (Dept. of Ceramic Science and Engineering, Rutgers University, Piscataway NJ 08855, USA) www.rci.rutgers.edu/~ecerg/projects/ferroelectric.html (50 pages).

* cited by examiner

Primary Examiner—David Nelms
Assistant Examiner—Ly Duy Pham
(74) Attorney, Agent, or Firm—Marger Johnson & McCollom, P.C.

(57) ABSTRACT

A ferroelectric memory device comprises a plurality of subarrays having a plurality of bitlines and a plurality of wordlines crossing over the bitlines. Ferroelectric material is disposed between the wordlines and the bitlines to define a ferroelectric cell at each crossing of the wordlines and bitlines. Each subarray further comprises left and right voltage converters disposed on opposite sides thereof, to drive respective first and second sets of wordlines within the subarray. A plurality of global wordlines are couple to the left and right voltage converters of each subarray and are configured to establish the drive levels for respective wordlines of the subarrays. A bitline multiplexer selectively couples the bitlines of a select subarray to a plurality of sense amplifiers.

8 Claims, 12 Drawing Sheets

FERROELECTRIC MEMORY DEVICE AND METHOD OF READING A FERROELECTRIC MEMORY

BACKGROUND

The present invention relates generally to semiconductor memory and, more particularly, to architectures for a ferroelectric memory and methods of reading such ferroelectric memory.

Exemplary known semiconductor memory include dynamic random access memory (DRAM), static random access memory (SRAM), electrically programmable read only memory (EPROM), flash memory, and ferromagnetic semiconductor memory devices. SRAM and DRAM devices are volatile, and require continuous power for data retention. When power is removed from these volatile devices, data is lost.

Unlike the volatile devices, nonvolatile memory retains data in the absence of power. Exemplary nonvolatile memory include the magneto-resistive, ferro-magnetic, and ferroelectric memory devices. Recently, some manufactures of nonvolatile memory have been working to improve ferroelectric memory devices.

Referencing FIGS. 1 and 2, an exemplary known ferroelectric cell 10 comprises ferroelectric material 16 sandwiched between first and second electrodes 12, 14, such as, for example, wordline 20 and bitline 22 of a known ferroelectric memory array. The spontaneous polarization $P_s$ vector characterizes an alignment of domains of the ferroelectric material as influenced by an electric field. Upon removal of the electric field, a remanent polarization $P_r$ remains. Applying a switching level electric field of opposite polarity reverses the polarization orientation.

The polarization versus voltage properties of an exemplary ferroelectric cell is characterized by hysteresis curve 24 of FIG. 3. The hysteresis curve crosses vertical axis 28 at two locations 21, 23 representative of the remanent polarizations associated with the "0" (zero) and "1" (one) state storage conditions. In FIG. 3, curve 24 shows remanent polarization $P_r$ for the memory under zero bias at position 21 with a magnitude less than that of the saturation polarization $P_s$ at bias position 25. This is understood to result because some of the domains of the ferroelectric do not stay aligned when the applied voltage bias is reduced, e.g., from the saturation level $V_s$ to zero.

Further referencing FIGS. 2–3, by applying a negative voltage $-V_s$ to wordline 20 relative bitline 22, the cell's polarization is set to its negative orientation (following path 34 of curve 24 to position 27) for storing a "one" state condition. Upon removing the applied voltage, the cell's negative polarization remains (path 36 to remanent position 23). Thereafter, applying a positive voltage $V_s$ reverses the cells polarization state, which "one" to "zero" polarization reversal is accompanied by an associated charge release. In contrast, a cell of a zero state would not provide such charge release with application of positive $V_s$. This difference in the released charge between the "one" and "zero" states provides the fundamental principle for reading a ferroelectric cell.

Ferroelectrics also exhibit resilience, wherein a ferroelectric cell can restore a remanent polarization despite a small disturbance. For example, assuming a one state storage condition for a ferroelectric cell, as represented by remanent polarization position 23 of hysteresis curve 24, a small voltage disturbance of $V_s/3$ provides a small polarization shift 40 along path 38. However, once the voltage is removed, domains of the ferroelectric cell realign their orientations to that of the cell's overall orientation, as illustrated by return path 39 of hysteresis curve 24.

BRIEF DESCRIPTION OF THE DRAWINGS

The invention may be best understood by reading the disclosure with reference to the accompanying drawings, wherein.

DETAILED DESCRIPTION

Figure 4:
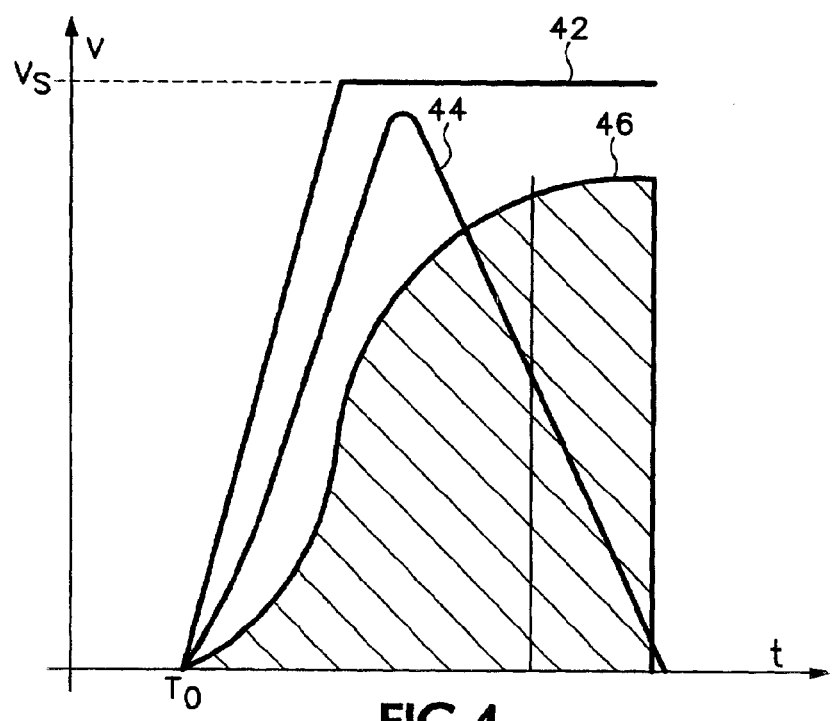
FIG. 4 is a graph schematically illustrating reading of a ferroelectric cell, including wordline activation, charge release from a ferroelectric cell, and integrated accumulation of released charge.

FIG. 4 simplistically illustrates reading of a ferroelectric cell of a one-state storage condition, wherein charge is released and integrated during application of a switching level voltage. At time $T_0$, bias 42 of the active wordline transitions to a switching level $V_s$, which causes a charge release 44 from the ferroelectric cell. By integrating the released charge, signal 46 results. Absent released charge, the integrated result is zero.

As used herein, the term "switching" level may be used interchangeably with "read" level, yet both characterize a voltage potential of magnitude sufficient to enable switching of a polarization state of the ferroelectric cell.

"Quiescent" refers to a level or bias to preserve a data state of ferroelectric memory. For example, a ferroelectric cell may have a quiescent potential of $V_s/3$ between its electrodes and still preserve its data state. A $V_s/3$ voltage level may be referred to as a quiescent level relative to an opposing cell plate voltage level within the range of 0 volts or $2V_s/3$. Within this range, the ferroelectric cell sees a potential difference less than $V_s/3$. Similarly, $2V_s/3$ may be referred to as a quiescent level relative to an opposing cell plate voltage bias within the range of $V_s/3$ and $V_s$. In like manner, a quiescent condition for a subarray implies data retention of the array, in which the memory cells of the array have applied potentials between opposing plates less than $V_s/3$.

Figure 5:
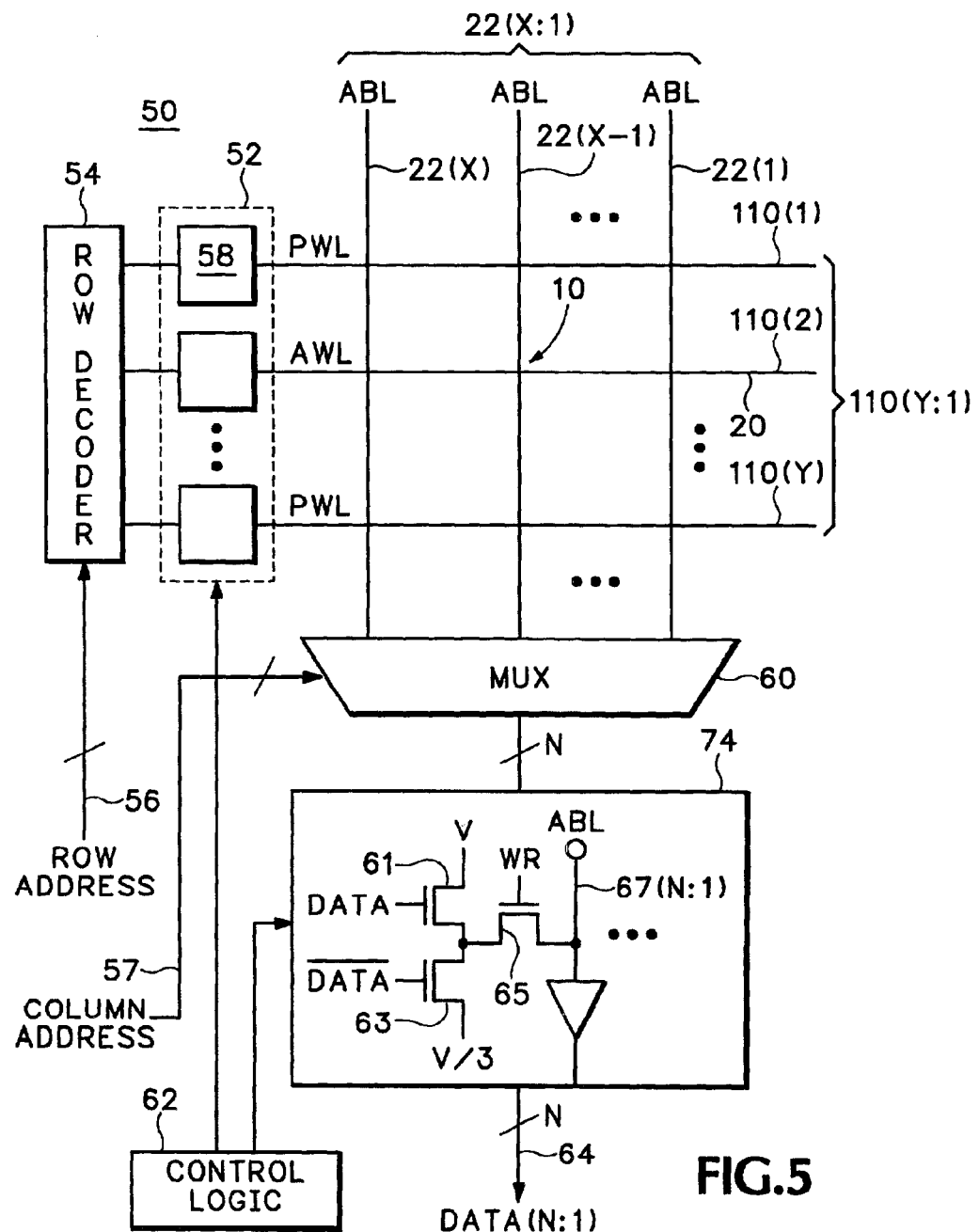
FIG. 5 is a simplified schematic diagram of a ferroelectric memory device illustrating bitline write circuitry associated with exemplary embodiments of the present invention.

Referencing FIG. 5, a known ferroelectric memory device 50 comprises a plurality of bitlines 22<X:1> and a plurality of wordlines 110<Y:1>. Ferroelectric material between the wordlines and bitlines provides for ferroelectric memory cells 10 at each crossing of a bitline and wordline. Sense amplifier-write drivers 74 are coupled to select active bitlines 22 and are operative to determine, in accordance with released charges, the states of a select row of cells when activated by active wordline (AWL) 20. "Active" identifies the wordline associated with reading the select row of ferroelectric cells. Non-active wordlines are identified as passive wordlines (PWL). Row decoder 54 receives row addresses 56 and is operative to decode an address to define a select active wordline 20 from amongst the plurality of wordlines 110. Voltage converter 52 receives logic level signals of row decoder 54, and drives the plurality of wordlines 110 with ferroelectric level signals as designated by decoder 54. For example, during activation of an active wordline, voltage converter provides the active wordline a read level voltage $V_s$ while providing the passive wordlines lower level voltages.

Continuing with reference to FIG. 5, column decoder and multiplexer 60 selects, in accordance with a received column address 57, particular bitlines of the array to be coupled to the sense amplifiers/write drivers 74 for respective read/write operations. The data <X:1> of the selected active bitlines is sensed by sense amplifiers 74 and sent out as output data <N:1>. Control logic 62 controls the operation of the sense amplifiers 74 and voltage converter 52, and provides them the timed transitions to enable the sense amplifiers to sense charge during activation of active wordline 20. The control logic is further operative to control timing of the write drivers (of sense amplifier-write drivers 74) and the voltage converter 52 to rewrite, e.g., "one" states back into the cells as needed following their destructive reads.

Figure 1:
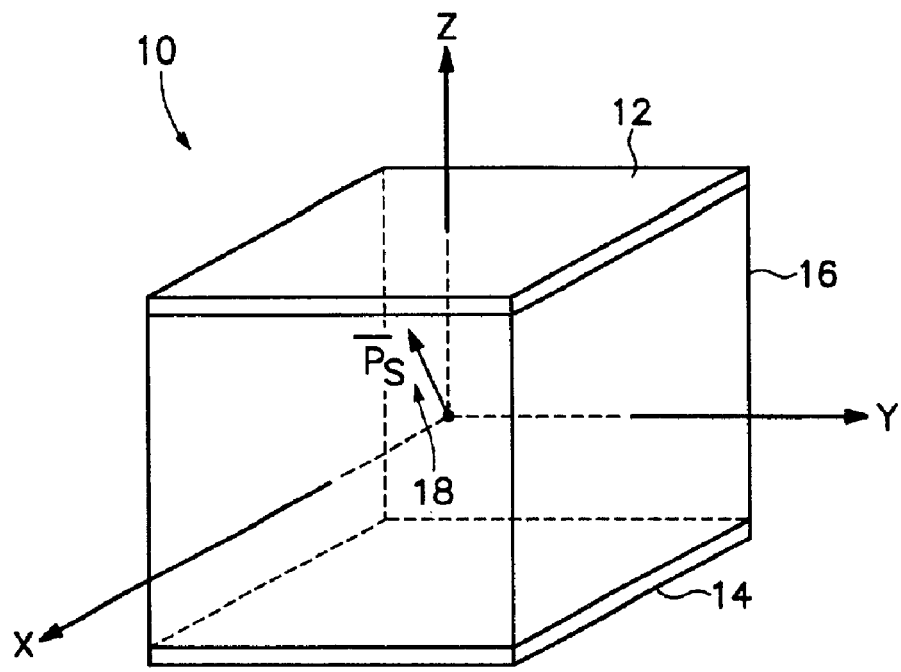
FIG. 1 provides an isometric view of an exemplary known ferroelectric cell.
Figure 2:
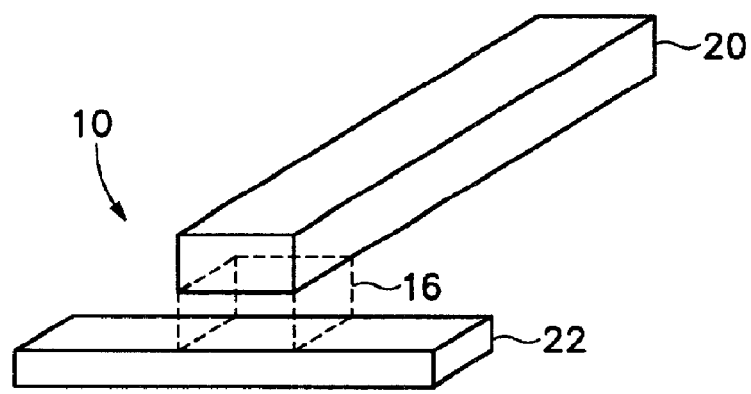
FIG. 2 provides a partial cross-sectional and isometric view of a known ferroelectric cell between a wordline and bitline.
Figure 3:
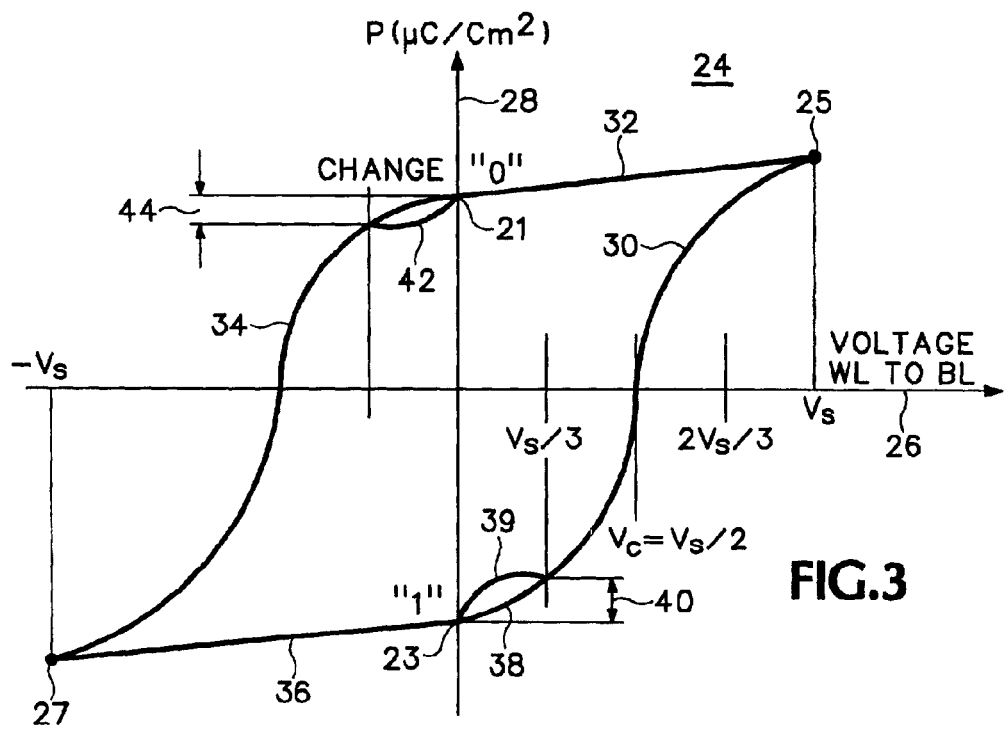
FIG. 3 is a graph depicting a simplified polarization versus voltage hysteresis curve for a ferroelectric cell.

For example, transistors 61, 63, 65 are associated with each of the selected bitlines of the array and have their gates driven during a write procedure to send write-back data to the bitlines and memory cells. To send one data, transistor 61 is enabled to couple the active bitline to $V_s$. For the other bitlines, which are not to receive one data, their write circuit transistors 63 are enabled to select biasing by $V_s/3$. Next, during the write operation, when transistors 65 of each of the drivers are enabled, the $V_s$ level is applied to those bitlines that are to receive one data and the quiescent level is applied to the others. To write select active memory cells, an active wordline 20 is biased with a low voltage level (e.g., 0V) such that the active cells between the active wordline and the active bitlines will have their polarization states set in accordance with the voltages applied to the bitlines. Cells receiving a full $-V_s$ bias achieve a one state polarization condition (position 27 relative to FIG. 3), while the other cells of the array receive quiescent level biasing.

Further referencing the known ferroelectric memory device 50 of FIG. 5, the voltages required to read or write ferroelectric cells within the array are typically greater than those of the device's other logic circuits. For example, address decoder 54 and output multiplexer 60 can utilize 5V logic level signals; whereas, biasing of the ferroelectric cells may require larger voltage levels, e.g., such as switching level voltages $V_s$ as large as 18V. Therefore, the circuits that interface the array—e.g., sense amplifiers, write drivers, voltage converter wordline drivers—such interface circuits employ large voltage transistor devices of large geometries, in contrast to the smaller voltage and geometry transistors of the logic circuits.

As recognized herein, the sense amplifier or driver of sense amplifier and write driver 74 can have a minimum width as much as four times greater than the minimum pitch geometry across bitlines of the array—i.e., the width from one bitline 22<n> relative to a neighboring bitline 22<n+1>. Accordingly, the known provision of one sense amplifier for each bitline would seem to waste semiconductor real estate.

Likewise, wordline driver or converter circuits 52 at the boundary of the array may require large transistor devices for handling the read level voltages $V_s$ associated with driving wordlines of the ferroelectric array. Thus, a one-to-one, driver-to-wordline layout allocation at one edge of the array can also cost, as recognized herein, excess semiconductor real estate.

Recognizing at least some of these limitations, the present invention proposes new exemplary embodiments for ferroelectric memory devices and methods of reading such ferroelectric memory devices.

Figure 6:
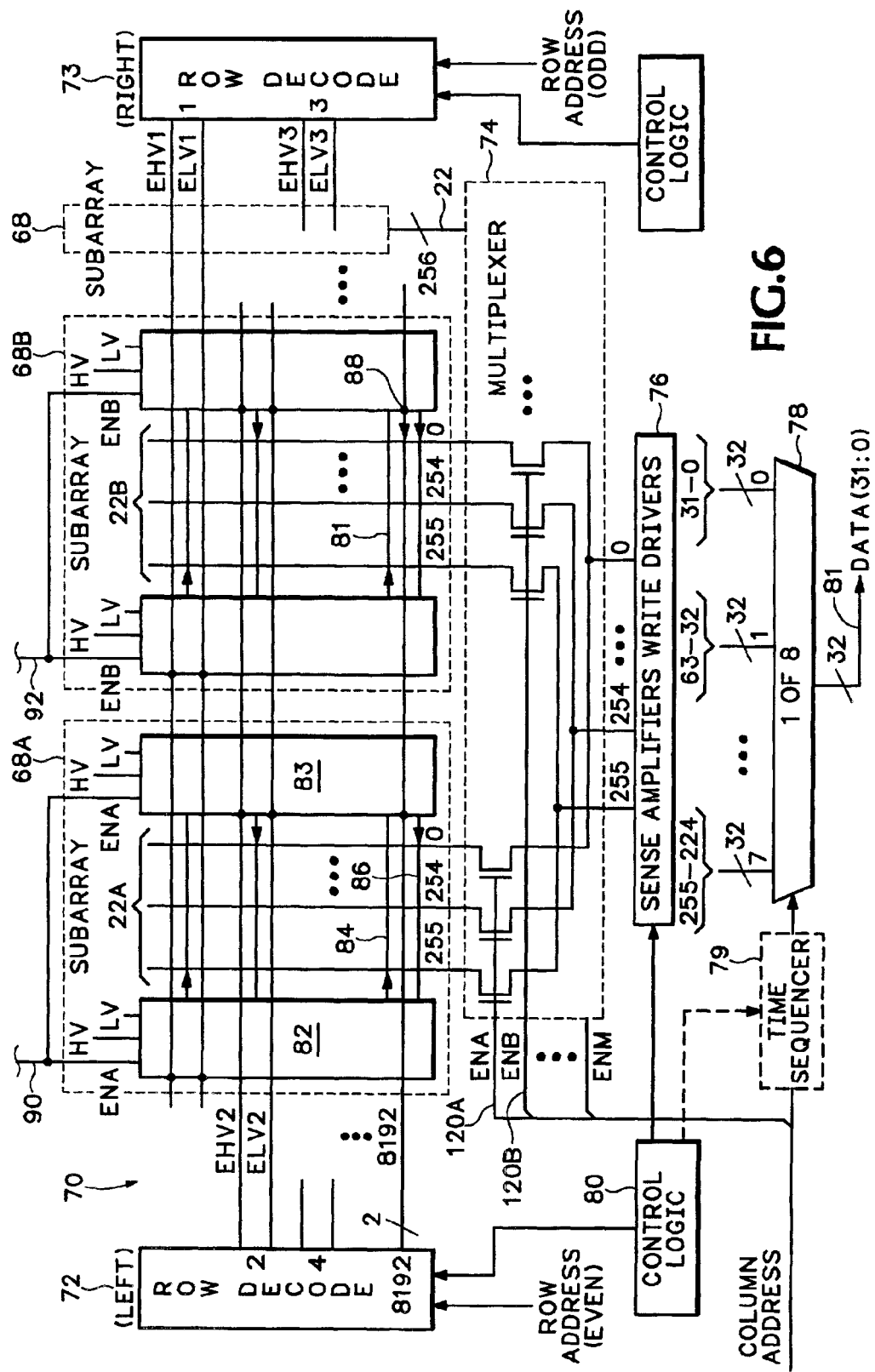
FIG. 6 is a schematic diagram of a ferroelectric memory device and architecture therefor in accordance with exemplary embodiments of the present invention.

Referencing FIG. 6, ferroelectric memory device 66, in accordance with an exemplary embodiment of the present invention, comprises a plurality of subarrays 68A, 68B, 68 that each comprises respective plurality of bitlines 22A, 22B, 22. For purposes of illustration, only three subarrays are shown in FIG. 6. However, it is understood that the scope of the present invention anticipates various number of subarrays. For a particular exemplary embodiment of the present invention, ferroelectric memory device 70 comprises eight subarrays 68. Additionally, for the illustrated exemplary embodiment of FIG. 6, each subarray is illustrated with 256 bitlines <255:0>. Again, it is understood that the scope of the present invention anticipates other pluralities of bitlines 22. None the less, for the illustrated exemplary embodiment of 256 bitlines for each of the eight subarrays, the combined subarrays provide an overall total of (256× 8)=2048 bitlines.

Further referencing FIG. 6, enable lines 120A, 120B, 120 of multiplexer 74 receive select signals ENA, ENB . . . ENM from a known column address decoder (not shown). Multiplexer 74 determines in accordance with signals ENA, ENB . . . ENM, from which of the subarrays to couple the plurality of bitlines 22 to the plurality <255:0> of sense amplifier-write drivers 76. Accordingly, by multiplexing the subarrays to shared sense amplifiers and drivers, a geometric limitation of the sense amplifiers and write drivers, when designed into an integrated circuit layout, can be distributed across the widths of multiple bitlines of the subarrays.

In accordance with a particular exemplary embodiment, output multiplexer 78 receives eight 77<7:0> 32-bit data word groups from the sense amplifiers 76 and outputs the select words as determined in accordance with column address information. In accordance with an optional aspect of the present invention, a known time-division sequencer 79 sequences configurations of multiplexer 78 to couple words 77<0>, 77<1>, 77<2> . . . 77<7> sequentially to output 81.

In accordance with an alternative exemplary embodiment, a known data latch is configured between, or as a part of either, sense amplifiers 76 and output multiplexer 78. Such data latch is operative to capture data of sense amplifiers 76 upon their determination of data of the selected cells within the array. By capturing this data, the latch retains the data for delayed output and permits the sense amplifiers to be cleared or reconfigured for alternative operations.

Figure 7:
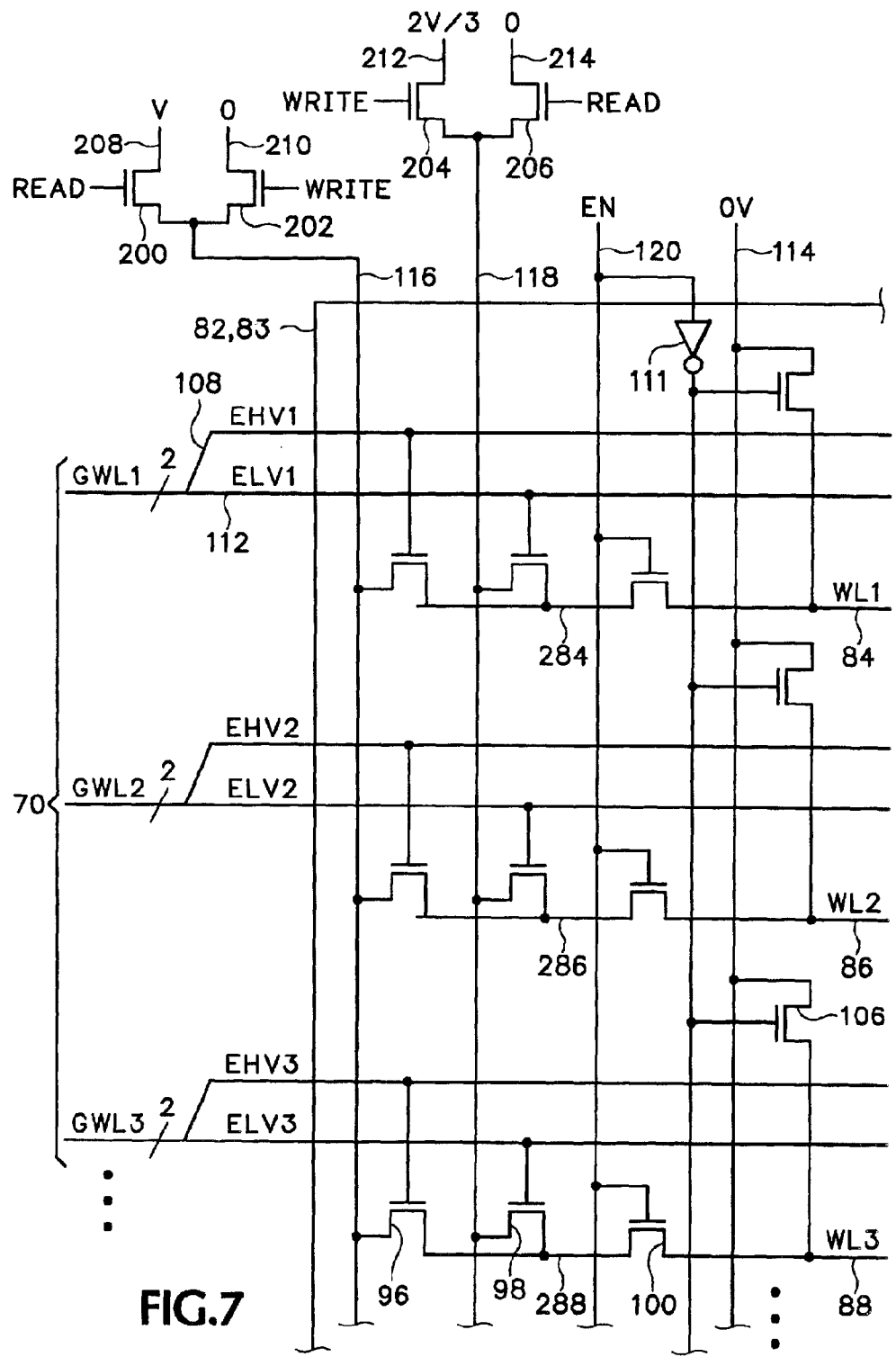
FIG. 7 is a simplified schematic diagram showing a portion of a voltage converter for a ferroelectric memory array in accordance with exemplary embodiments of the present invention.

Referencing FIGS. 6–7, each subarray 68A, 68B . . . 68, comprises left and right low-to-high voltage converters 82, 83 disposed along the length and outside the boundary of bitlines 22. Left converter 82 comprises a plurality of wordline drivers, each having a transistor group like group 96, 98, 100, 106 (FIG. 7) and associated with driving the odd wordlines WL1, WL3, WL5 . . . Similarly, the right converter 83 comprises a plurality of wordline drivers, each having a transistor group like 96, 98, 100, 106 and associated with driving the even wordlines WL2, WL4, WL6 . . . In FIG. 6, the left and right converters are shown coupled to respective odd/even wordlines per arrowheads 81. In this fashion, the dimensional width of a wordline driver, i.e., transistor grouping 96–106 of converter 82 or 83, can be distributed across the width of more than one wordline.

The left and right low-to-high voltage converters 82, 83 are configured to receive respective odd and even global wordline pairs of enable high and enable low voltage signals. For example, a first global wordline pair GVL1 of the plurality 70, comprises line 108 and line 112 (FIG. 7) that will carry enable high signal EHV1 and enable low signal ELV1 respectively to the group of transistors in converter 82 that are associated with driving first wordline WL1. The second global wordline pair GWL2 carry signals EHV2 and EHV2 to right side converter 83 to control the transistors associated with driving second wordline WL2. In accordance with a preferred exemplary embodiment, decoders 72, 73 of the even and odd global wordlines are disposed on opposite sides of the memory array, e.g., left and right sides respectively as shown in FIG. 6. Despite the left and right side physical placements of the converters 82, 83 relative to each of the subarrays, in FIG. 7, they are schematically illustrated in combined fashion in order to simplify an understanding of their operation for driving the wordlines within the subarrays.

Figure 8A:
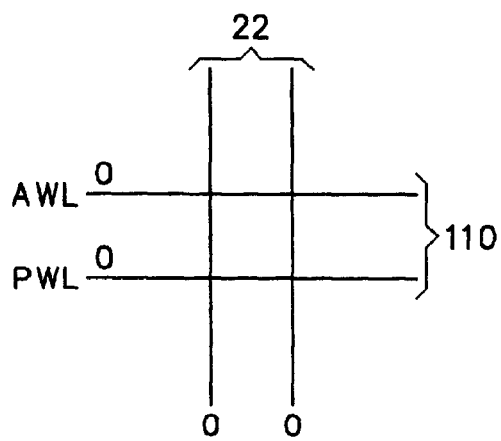
FIGS. 8A and 8B schematically illustrate a couple of wordlines and bitlines of a ferroelectric memory array showing different bias conditions during reading of the ferroelectric memory in accordance with exemplary embodiments of the present invention.
Figure 8B:
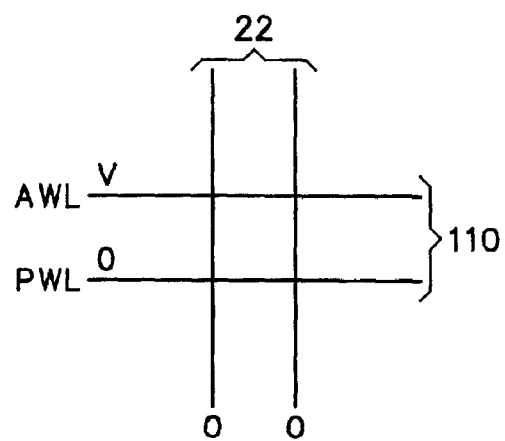
Figure 10A:
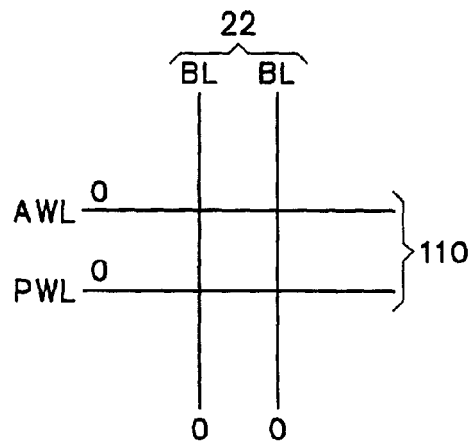
FIGS. 10A–10H schematically illustrate a couple of wordlines and bitlines of a ferroelectric memory array showing different bias conditions during writing of the ferroelectric memory in accordance with exemplary embodiments of the present invention.
Figure 10B:
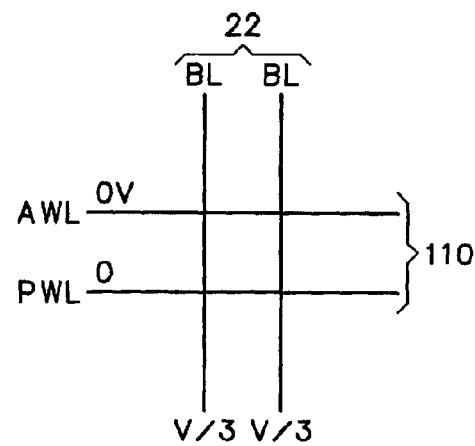
Figure 10C:
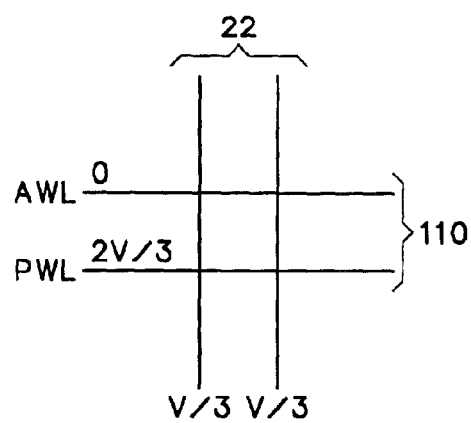

To assist the understanding of certain exemplary embodiments of the present invention, FIGS. 8A–8B show the different bias conditions for bitlines and wordlines of a subarray during a read procedure, while FIGS. 10A–10H show the bias conditions during write procedures. Both the read and write procedures assume a starting, quiescent condition with all bitlines and wordlines receiving a bias of 0 (FIGS. 8A and 10A).

Figure 9:
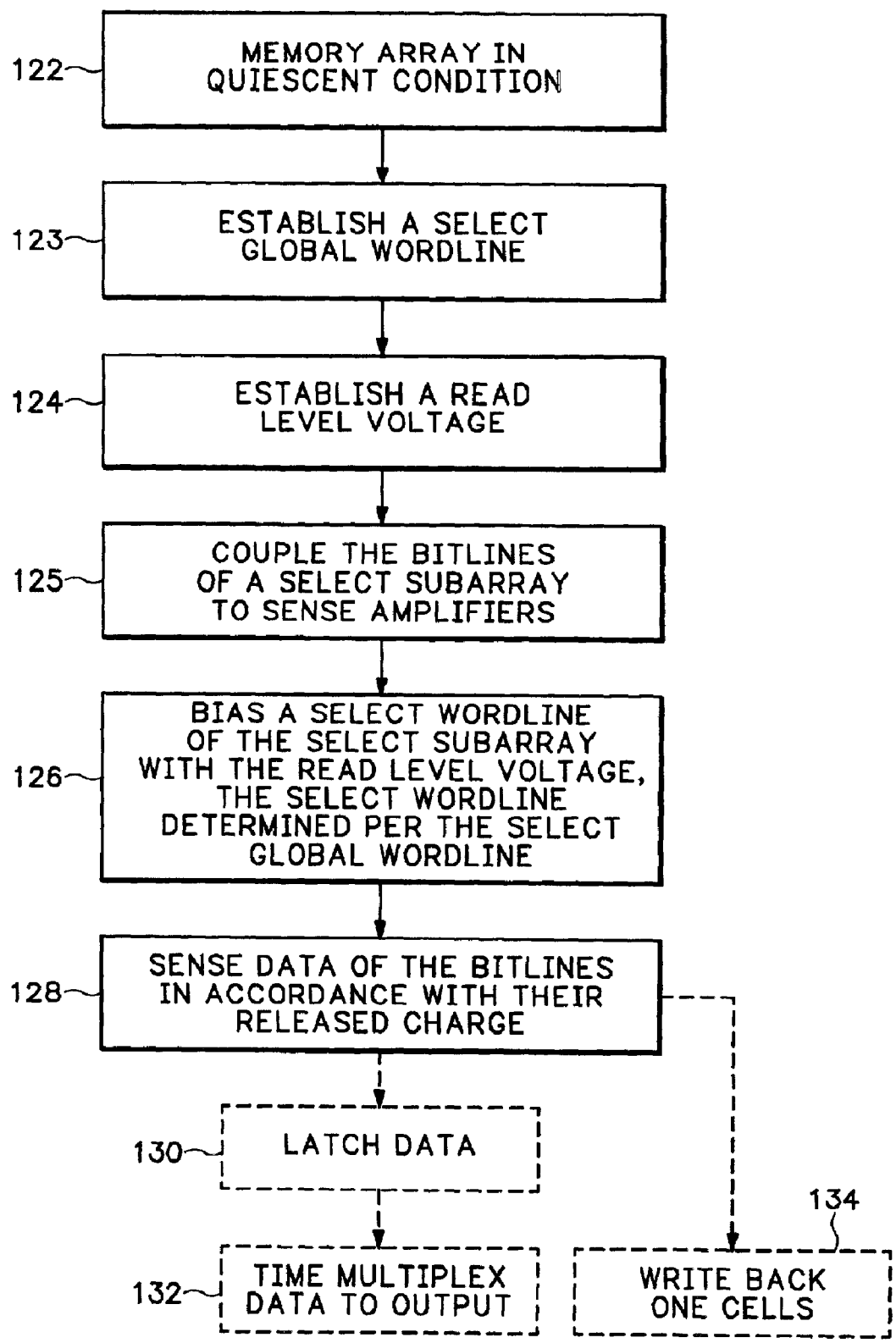
FIG. 9 is a flow chart representative of a method of reading a ferroelectric memory in accordance with exemplary embodiments of the present invention, and describing a procedure to read a row of memory cells of a select subarray.

In the read operation, referencing FIGS. 6–9 the low-to-high voltage converters 82, 83 establish the voltage levels that are applied to wordlines of the plurality 84, 86, 88 as determined by the global wordlines 70 and enable line 120. For example, in one embodiment, subarray enable signal EN is held low to disable a subarray 68. With the enable signal EN held low, transistors 100 are turned-off and transistors 106 turned-on via inverter 111. Accordingly, wordlines 84, 86, 88 (FIG. 7) receive voltage 0 via transistors 106. Likewise, bitlines 22 of the disabled subarrays also receive the low level voltage of 0 as represented by FIG. 8A. With each of the wordlines and bitlines receiving the low voltage bias, the ferroelectric material of the cells between the wordlines and bitlines of the subarray remain in a quiescent condition to preserve their polarization states. With reference to FIG. 9, this is represented by block 122.

Regarding the voltage levels, for example, referencing FIG. 7, supplies 208, 210, 212, 214 are shown with levels $V_s$, 0, $2V_s/3$ and 0. In a particular exemplary embodiment, the low voltage 0 is equal to 0V and the high voltage a polarization switching-level magnitude $V_s$ of 18V. Accordingly, the levels $2V_s/3$ and $V_s/3$ are 12V and 6V respectively. In alternative embodiments, a common offset voltage $V_{BL}$ (e.g., 2 volts) is introduced and the voltages 0, V/3, 2V/3 and V equal 2, 8, 14 and 20 volts respectively. However, for purposes of simplifying the present disclosure, offset voltage $V_{BL}$ is assumed equal to 0 volts.

Under the initial memory array quiescent condition, all lines EHV, ELV of the global wordline pairs 70 are biased high, low respectively, and the read and write control signals READ, WRITE set low to disable transistors 200–206. Accordingly, each of the nodes 284–288 (i.e., between respective wordline bias transistors 96 and 98) are left floating—isolated from wordlines WL1–WL3.

For a read operation, further referencing FIGS. 6–9, row decoders 72, 73 receive a row address and determine (123 of FIG. 9) in accordance with the address a select global wordline of the plurality 70 that is to be driven as an active global pair. Typically, only one wordline is activated during a read. Control logic 80 controls the timing of row decoders 72, 73 the enable signals and the sense amplifier and write driver 76 operations during their read process to sequence the bias conditions has described below. In establishing a select global wordline, the levels of the selected global wordline pair 70 toggle. Assuming the third global wordline pair GWL3 is selected, signal ELV3 transitions low and EHV3 transitions high to turn-off transistor 98 and turn-on transistor 96 of the select wordline driver group (FIG. 7). Under this condition, the common node 288 between the transistors is coupled to active bias line 116. The other nodes 284, 286 remain coupled to passive bias line 118.

In accordance with a further exemplary embodiment of the present invention, referencing FIG. 6, the row decoder of the memory device comprises left and right row decoders 72, 73 of respective even and odd global wordline driver circuits. The left decoder 72 receives the even row addresses for designating and activating selected even global wordline pairs. The right decoder 73, on the other hand, receives the odd row addresses for designating and activating selected odd global wordline pairs. Using this split decoder layout architecture, the global wordline drivers of the left and right decoders can be interleaved to enable separate respective driver geometries to be sized across multiple widths of a wordline pitch of the memory array.

In addition to toggling the levels of a select global wordline pair, a read level voltage is established (124 of FIG. 9). The controller asserts a read-signal READ to enable transistors 200 and 206 (FIG. 7) associated with the bias trees of their respective active and passive bias lines 116, 118. Node 288 for an active wordline receives bias $V_s$ via its transistors 96 and 200, and nodes 284, 286 for the passive wordlines receive bias 0 via their respective transistors 98 and 206.

Continuing the read operation, control logic 80 sends an enable signal (e.g., ENA) to the subarray and multiplexer 74, for coupling (125 of FIG. 9) the bitlines 22A of the enabled subarray to sense amplifiers of the sense amplifier and write drivers 76. Additionally, the voltage converter 82, 83 (FIGS. 6–7) of the select subarray receive the enable signal for turning-on transistors 100 and turning-off transistors 106 of each row driver group to bias (126 of FIG. 9) the wordlines with the active and passive read level voltages. The select active wordline receives the high level voltage $V_s$ via transistors 100, 96, 200, and the passive wordlines receive the low level bias 0 by way of transistors 100, 98, 206. With such read bias condition, as shown in FIG. 8B, sense amplifiers are enabled by the controller to sense the bitlines for released charge as a part of determining data (128 of FIG. 9) of the select group of ferroelectric cells. In accordance with a particular embodiment, the group of cells provide for a full data word.

After determining the data, referencing FIG. 6, in accordance with a further exemplary embodiment of the present invention, multiplexer 78 outputs data from select portions of the sense amplifiers to output lines 81, as determined in accordance with additional addressing. For example, in a particular exemplary embodiment, 256 bits of data 77 of the sense amplifiers are divided into 8 different 32-bit partitions <31:0>, <63:32> . . . <255:224>. Multiplexer 78 selects, in accordance with the received column address, one of the groups for presentation to port 81 as output data<31:0>. It is understood that the scope of the present invention will encompass alternative partitions, widths and multiplexing configurations.

Again, as mentioned earlier herein, alternative exemplary embodiments of the present invention comprise a data latch configured between, or as a part of, the sense amplifiers 76 and multiplexer 78. After the sense amplifiers have determined data of the select group of cells, control logic 80 triggers the data latch to capture (130 of FIG. 9) the read data, thereby making the data available for delayed processing. Likewise, optional time-division multiplexing circuits and configurations as known in the art can provide time based sequential multiplexing 132 of partitioned data to the output port.

Because a read operation is destructive, i.e., the cell loses its data after the read, the cells of one state determinations are typically restored (134 of FIG. 9) following the read. During an exemplary write-back process, the active wordline of the select subarray is driven to a low voltage bias, for example, 0V, the passive wordlines charged to $2V_s/3$ and the bitlines biased with $V_s$ levels for writing one data and otherwise biased with $V_s/3$. Write drivers of sense amplifier-write drivers 76 that are to write-back one data are configured with high level write voltages $V_s$, e.g., of 18V, and the drivers for the other bitlines configured to provide a quiescent level voltage $V_s/3$.

Figure 10D:
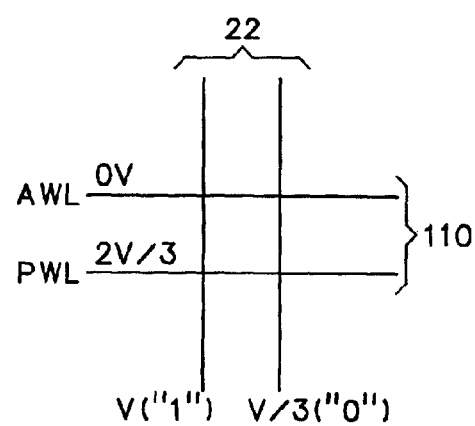
Figure 10E:
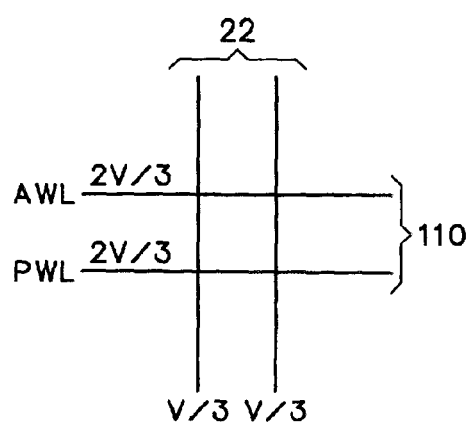
Figure 10F:
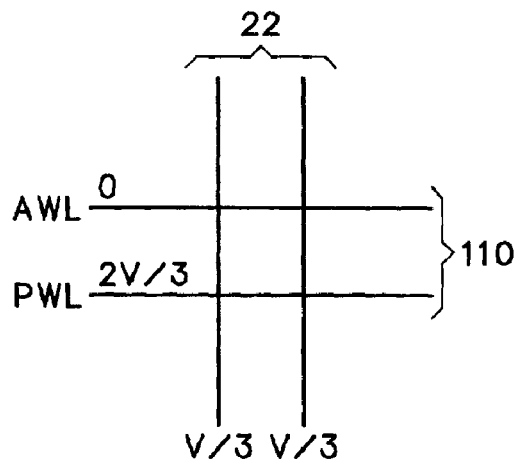
Figure 10G:
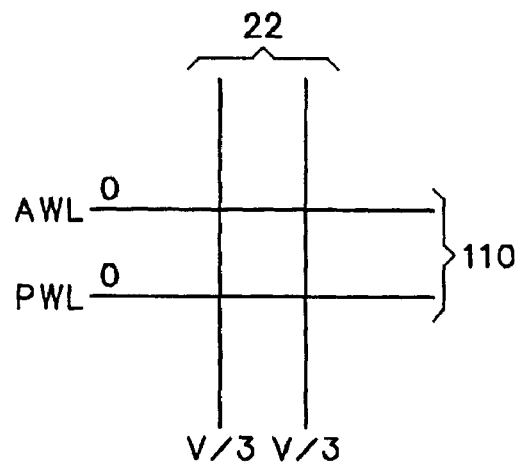
Figure 10H:
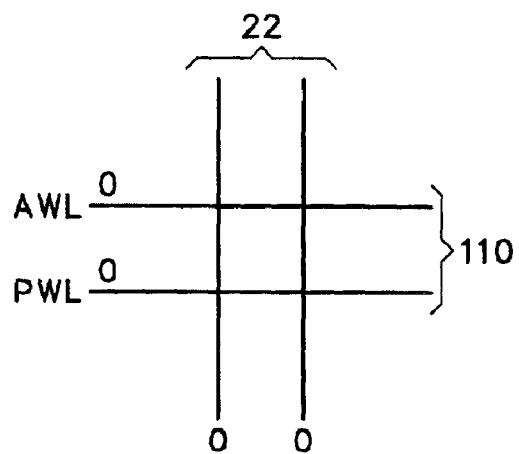
Figure 11:
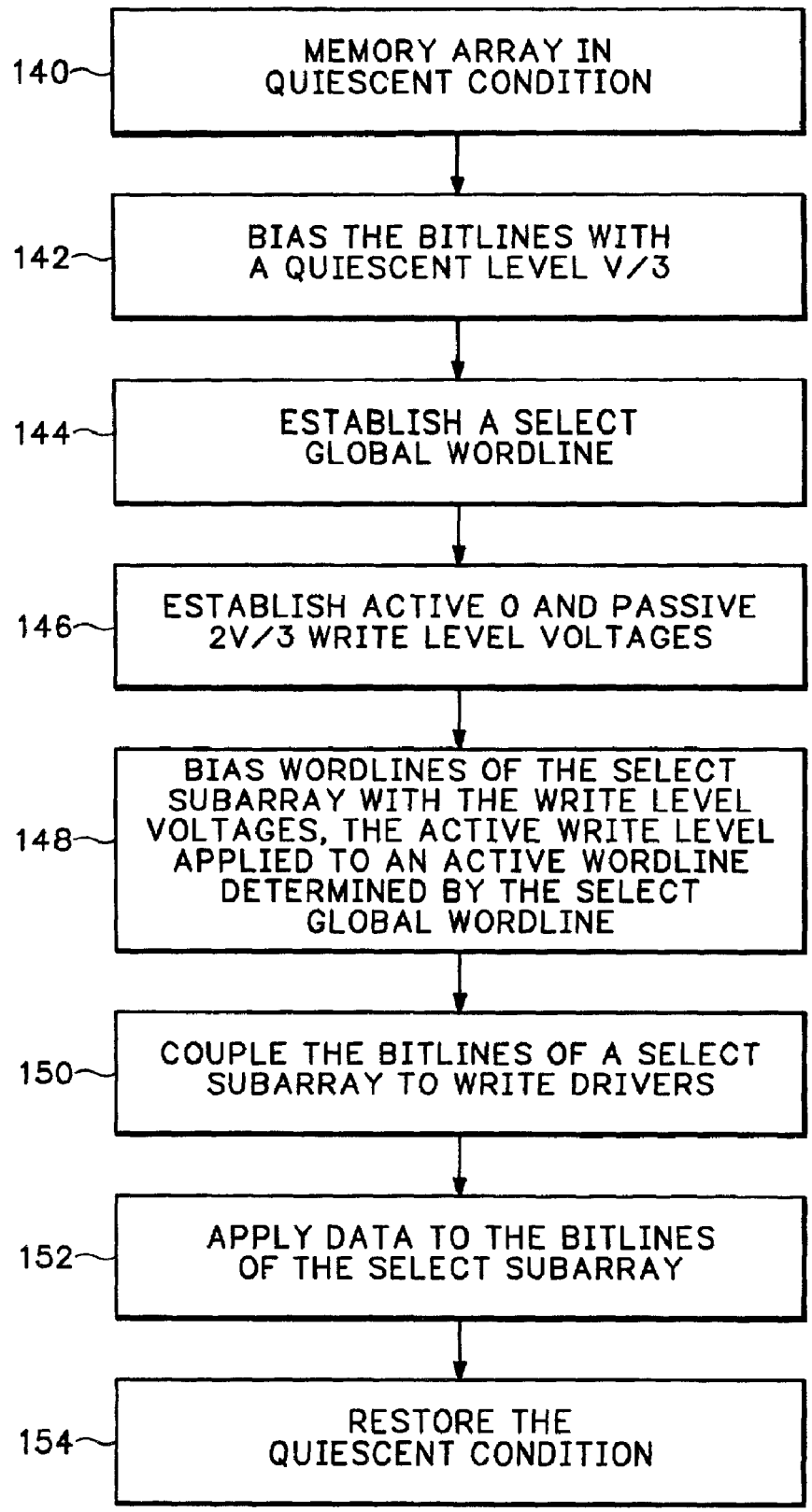
FIG. 11 is a flow chart representative of a method of writing-back data to a ferroelectric memory in accordance with an exemplary embodiment of the present invention.
Figure 12:
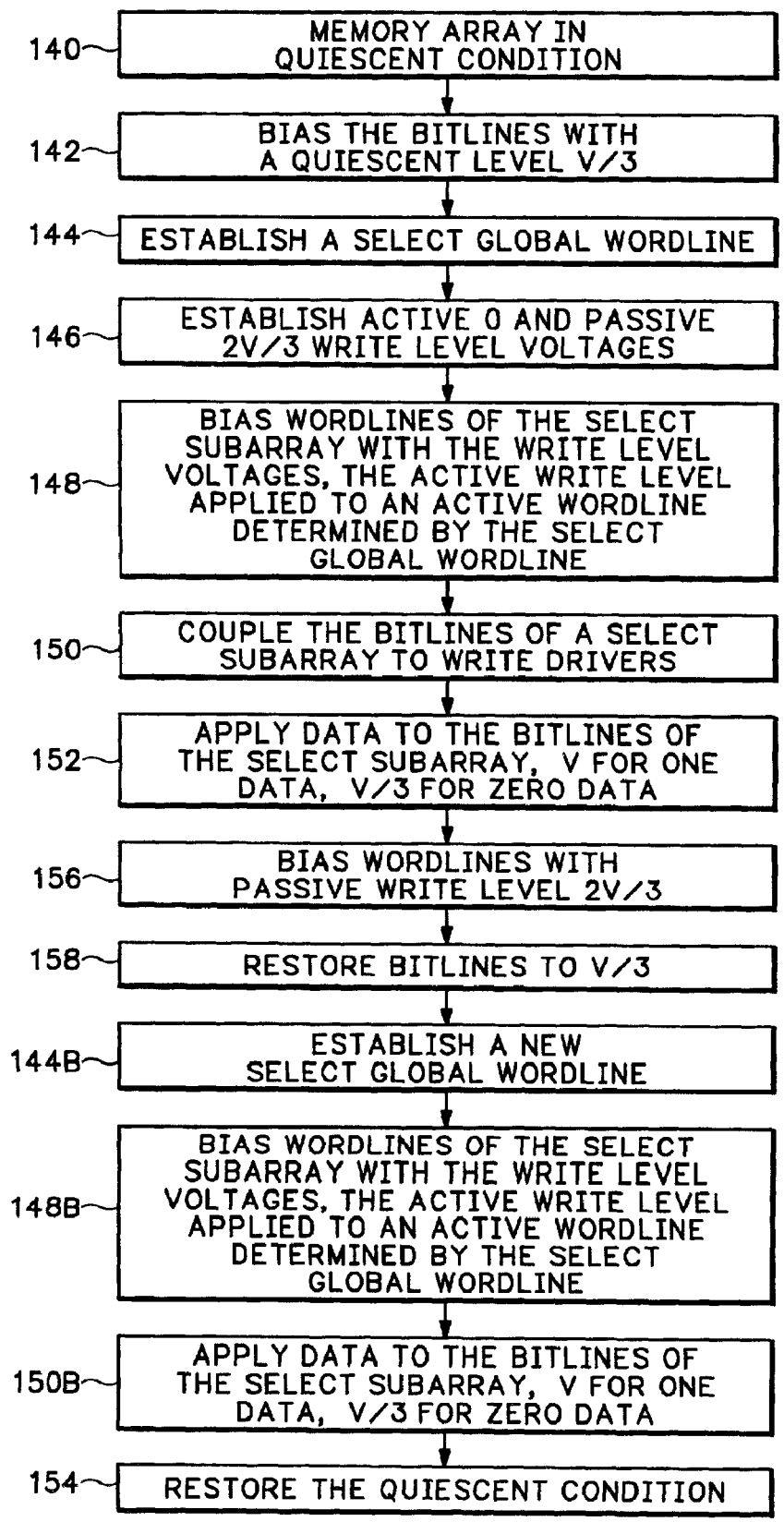
FIG. 12 is a flow chart representative of a method of writing a ferroelectric memory in accordance with an exemplary embodiment of the present invention, in which an intermediate quiescent bias condition is established between a series of separate writes to a select subarray.
Figure 13:
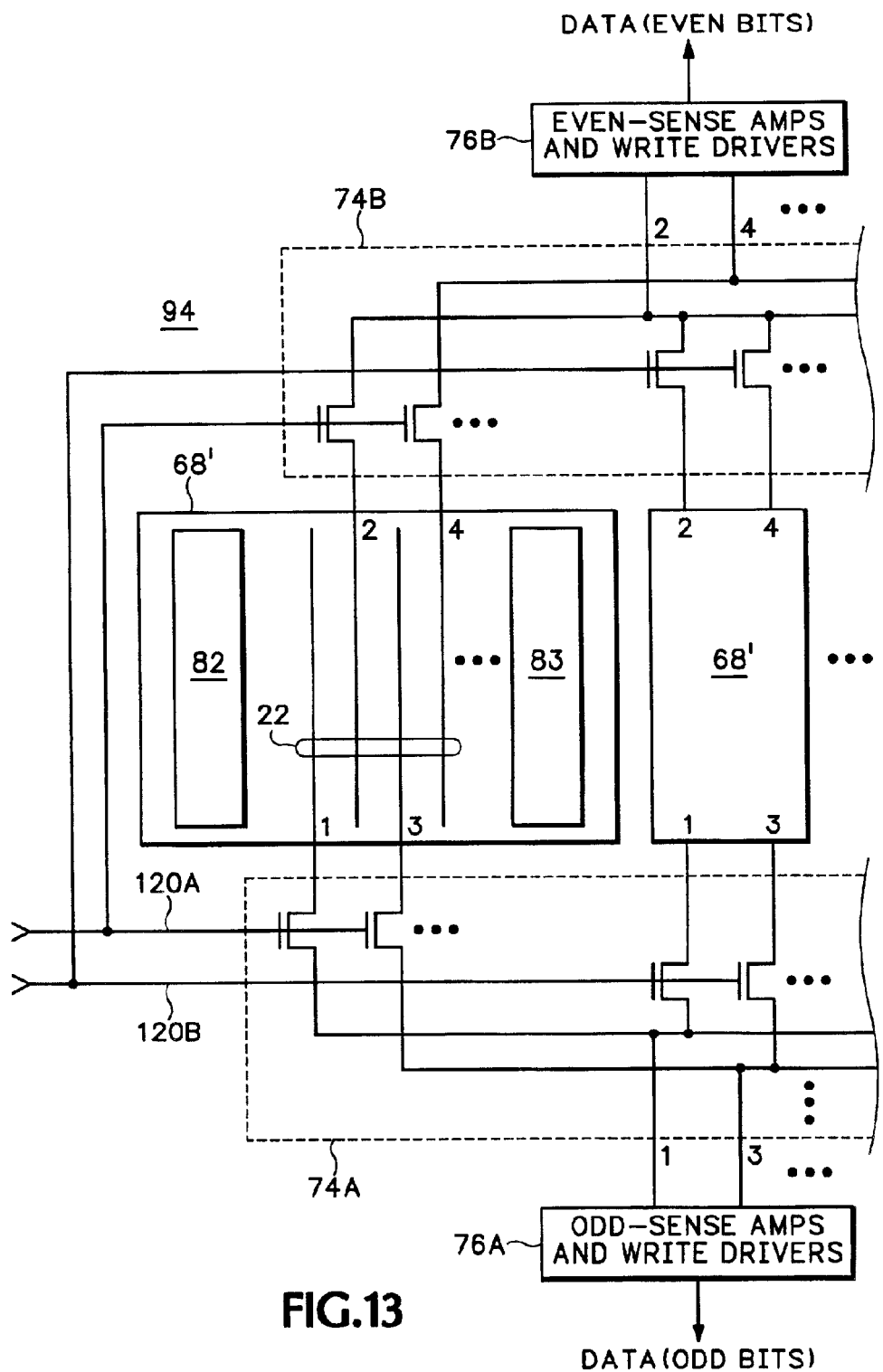
FIG. 13 is a schematic diagram of a ferroelectric memory device in accordance with another exemplary embodiment of the present invention, wherein column circuits are distributed on opposite sides of the ferroelectric memory arrays.

More specifically, with reference to FIGS. 6–7, 10A–10H and 11, the wordlines and bitlines initially begin with a low level voltages 0 as shown in FIG. 10A, and the memory cells of the array are in a quiescent condition (140 of FIG. 12). Both the read and write signals READ, WRITE are low to disabled transistors 200–206 (FIG. 7) to isolate nodes 234–388 between wordline driver transistors 96 and 98. Enable signal EN on line 120 is low, disabling transistors 100 and enabling transistors 106.

Row decoders 72, 73 (FIG. 6) receive odd and even row addresses and determine in accordance with the address information a select global wordline of the plurality 70 to be driven as an active global pair (144 of FIG. 12). Assuming, e.g., that the third global wordline pair is selected, lines ELV3, HV3 transition low and high respectively to disable transistor 98 and enable transistor 96. Node 288 is coupled to active bias line 116, and the other nodes 284, 286 are coupled to passive bias line 118.

Further referencing FIGS. 6–7, 10B and 11, bitlines transition from a bias of 0 to $V_s/3$ (142 of FIG. 12). An enable signal (e.g., ENA of FIG. 6) configures multiplexer 74 to couple (150 of FIG. 12) the bitlines 22A of a select subarray to receive voltages of the write drivers of sense amplifiers and write drivers 76. The enable signal also disables transistors 106 and enables transistors 100 of the wordline driver groups (FIG. 7) for the select subarray for coupling the wordlines 84–88 to respective bias nodes 284–288 (146 and 148 of FIG. 12). Although, some of the above write-procedure steps were described in a given sequence, it is understood that the order of some of these steps can very, as apparent by comparison of the exemplary flow chart of FIG. 12 relative to the sequence in just described. For example, an alternative sequence comprises establishing the write level voltages 146, selecting a global wordline 144, biasing the bitlines 142, biasing the wordlines 148 and then coupling the bitlines to the write drivers 150; so long as the resultant bias conditions of the wordlines and bitlines correspond to the bias condition sequence of FIGS. 10A–10D.

The controller sets the write signal WRITE high to enable transistors 200, 206 (FIG. 7) and couple the upper supply $V_s$ to the active bias line 116 and the quiescent level supply $2V_s/3$ to the passive bias line 118 (146 of FIG. 11). In addition to enabling transistors 65 for coupling the bitlines to the write drivers, the enable signal also enables transistors 100 of the respective wordline driver groups. Accordingly, the select active wordline receives the low level bias 0 via its transistors 202, 96, 100, and the passive wordlines receive the quiescent level bias $2V_s/3$ via their respective transistors 204, 98, 100, see FIG. 10C. The array is now ready to receive write data.

Moving forward to FIG. 10D, write-back data is applied to the bitlines (152 of FIG. 11). The high level voltage $V_s$ is applied to bitlines that are to receive one data by enabling transistors 61 (FIG. 5) of their respective bitline write circuits (61, 63, 65). For the other bitlines, the transistors 63 are enabled to apply the quiescent level V/3 bias. Although, not explicitly shown in FIG. 5, it is understood that sense amplifier and write driver 74 comprises a write circuit transistor group 61, 63, 65 for each of the bitlines 67(N:1). However, for purposes of simplicity, only one write circuit group 61, 63, 65 has been shown in FIG. 5 for an exemplary bitline 67. After writing the data into the memory array, the wordlines and bitlines are restored to their quiescent levels, FIGS. 10F–10H (154 of FIG. 12).

In accordance with a further exemplary embodiment, latches acquire data that has been previously read from the memory array. The latched data is then used as the basis for driving the gates of transistors 61, 63 during a data write-back. Alternatively, the latches receive write data from an external bus, which is then used for driving the gates of transistors 61, 63.

In accordance with an alternative exemplary embodiment of the present invention, the wordlines 110 and bitlines 22 are biased to an intermediate-write quiescent condition (156 and 158 of FIG. 12), instead of being fully restored to their low voltage bias conditions. The wordlines receive a bias voltage of $2V_s/3$ and the bitlines are biased with $V_s/3$ as shown by the diagram of FIG. 10E. To bias the passive wordlines with the quiescent level $2V_s/3$, referencing FIG. 7, the global wordlines are all set to a quiescent condition of ELV high, and EHV low. With the enable signal still asserted, all wordlines are coupled to the passive bias line 118, which is receiving the passive write level voltage 2V/3 via enabled transistor 204. From this intermediate quiescent state, the subarray is ready to receive additional write data.

Preferably, active and passive wordlines and bitlines do not have their respective bias levels changing at the same time. Only one of the levels of the active or passive WL or BL should change at each time step. (put this in the claim). Therefore, to reach the intermediate bias state of FIG. 10E, the bias levels of the wordlines and bitlines are first set to the levels of FIG. 10C (i.e., 0V for the active wordline, 2V/3 for the passive wordline, and V/3 for the bitlines) before finally transitioning to the levels of the intermediate write quiescent condition of FIG. 10E with all wordlines at 2V/3 and all bitlines at V/3. Likewise, the bitline of the one-data V("1") might first be transitioned from V to V/3 before the active wordline line is transitioned from 0 to 2V/3.

Typically, a new select global wordline is established 144B, further referencing FIG. 12, and the active and passive write levels applied to the active and passive wordlines respectively of the subarray. Again, as described earlier herein, the select wordline is determined by the newly selected global wordline. The new data to be written is used to drive the gates of the transistors 61, 65 of the write circuits for the bitlines 67(N:1) in sense amplifier and write driver 76. In this fashion, a sequence of word write cycles can be made to the same select subarray without having to fully restore the subarray's lower voltage level bias conditions.

The controller of the memory determines when multiple writes will be applied to the same select subarray. To save power and improve write speed, the controller upon anticipating the multiple sequential writes to the same subarray, will utilize the intermediate quiescent level between subarray writes. Absent such intermediate bias procedure for the sequential writes, additional delays and power consumption would be required for the bitlines and wordlines to swing all the way to 0 their low voltage bias levels.

With reference to FIGS. 6 and 8, in accordance with an alternative embodiment of the present invention, multiplexer 74 and sense amplifier-write drivers 76 are divided into two separate portions 74A, 74B and 76A, 76B respectively and are disposed on opposite ends of the subarray bitlines. A first set of bitlines are coupled to first multiplexer 74A, while the second set of bitlines are coupled to the second multiplexer 74B. More particularly, for example, odd bitlines 1, 3, 5 . . . of the plurality of bitlines 22 of each subarray 68' are coupled to the inputs of "odd" multiplexer 74A (e.g., at the bottom of the subarrays) and the even bitlines 2, 4, 8 . . . coupled to the inputs of "even" multiplexer 74B (at the top of the subarrays). Likewise, sense amplifiers and write drivers of the respective first and second (e.g., odd/even) portions 76A, 76B are coupled to the multiplexer outputs. Accordingly, by dividing the multiplexer and sense amplifiers into two separate regions across opposite ends of the subarrays, a layout density of the ferroelectric memory device, relative to its bitline pitch, can improve by a factor of two. Note, this factor of two is in addition the density improvement provided by the multiplexing ratio of multiplexer 74.

It will be apparent to those skilled in this art that the illustrated embodiments are exemplary and that various changes and modifications may be made thereto as become apparent upon reading the present disclosure. Accordingly, such changes and modifications are considered to fall within the scope of the appended claims.

What is claimed is:

1. A ferroelectric memory device, comprising:
   a plurality of subarrays comprising wordlines crossing over bitlines with ferroelectric material there between;
   first and second voltage converters disposed at respective first and second opposite sides of each of the subarrays;
   a plurality of global wordline pairs to route paired global wordline signals to the first and second voltage converters;
   the first and second voltage converters for a given subarray configurable to drive respective first and second sets of the wordlines of the subarray with voltage levels determined by the paired global wordline signals of the plurality of global wordline pairs and a subarray enable signal; and
   a plurality of sense amplifiers to sense data; and
   bitline multiplexer operatively configurable to couple the bitlines of a select one of the plurality of subarrays to the sense amplifiers.

2. A ferroelectric memory device according to claim 1, wherein the wordlines of the subarray comprise even and odd sequentially numbered, interdigitated wordlines;
   the first set of the wordlines comprise the even wordlines; and
   the second set of the wordlines comprise the odd wordlines.

3. A ferroelectric memory device according to claim 2, wherein the plurality of global wordline pairs comprise even and odd sequentially numbered pairs of the global wordline pairs;
   the odd numbered global wordline pairs of the plurality coupled to the first voltage converter of each subarray, and to provide respective paired wordline signals associated with establishing the drive voltages of the odd numbered wordlines; and
   the even numbered global wordline pairs of the plurality coupled to the second voltage converter of each subarray, and to provide respective paired wordline signals associated with establishing the drive voltages of the even numbered wordlines.

4. A ferroelectric memory device according to claim 1, wherein the plurality of sense amplifiers comprises first and second groups of sense amplifiers disposed on respective opposite sides of the subarrays;
   the bitline multiplexer comprising first and second portions;
   the first portion of the bitline multiplexer operatively configurable to couple a first set of the bitlines of the select subarray to the inputs of the first group of sense amplifiers; and
   the second portion of the bitline multiplexer operatively configurable to couple a second set of the bitlines of the select subarray to the inputs of the second group of sense amplifiers.

5. A ferroelectric memory device according to claim 4, further comprising data latches to latch data of the first and second groups of sense amplifiers.

6. A ferroelectric memory device according to claim 5, further comprising an output multiplexer to time multiplex separate groups of data from the data latches to an output.

7. A ferroelectric memory device according to claim 1, further comprising a row-decoder to generate signals for the global wordline pairs as determined in accordance with row address data.

8. A ferroelectric memory device according to claim 1, further comprising a column decoder to determine, in accordance with column address data, a subarray as the select subarray, and to provide thereto a subarray enable signal.

* * * * *